(12) United States Patent
Yasuda

(10) Patent No.: US 6,578,187 B2
(45) Date of Patent: Jun. 10, 2003

(54) DIGITAL CIRCUIT DESIGN METHOD USING PROGRAMMING LANGUAGE

(76) Inventor: Hiroshi Yasuda, 2-7-27, Miyanosaka, Hirakata, Osaka, 573-0022 (JP)

( * ) Notice: Subject to any disclaimer, the term of this patent is extended or adjusted under 35 U.S.C. 154(b) by 0 days.

(21) Appl. No.: 09/917,283

(22) Filed: Jul. 24, 2001

(65) Prior Publication Data

US 2002/0108092 A1 Aug. 8, 2002

(30) Foreign Application Priority Data

Aug. 3, 2000 (JP) .................................. 2000/236286

(51) Int. Cl.$^7$ .................. G06F 17/50; G06F 9/45; G06F 7/00; G06F 19/00
(52) U.S. Cl. .................. 716/18; 716/3; 717/106; 717/114; 717/137; 717/143; 703/16; 707/101
(58) Field of Search .................. 716/3, 18; 717/106, 717/114, 137, 143; 703/16; 707/101

(56) References Cited

U.S. PATENT DOCUMENTS

| | | | | |
|---|---|---|---|---|
| 5,355,496 A | * | 10/1994 | Fant et al. .................. | 717/141 |
| 5,870,585 A | * | 2/1999 | Stapleton .................. | 703/15 |
| 6,021,266 A | * | 2/2000 | Kay .................. | 716/2 |
| 6,035,106 A | * | 3/2000 | Carruthers et al. .................. | 703/1 |
| 6,053,947 A | * | 4/2000 | Parson .................. | 703/14 |
| 6,083,269 A | * | 7/2000 | Graef et al. .................. | 703/14 |
| 6,152,612 A | * | 11/2000 | Liao et al. .................. | 703/23 |
| 6,167,363 A | * | 12/2000 | Stapleton .................. | 703/14 |
| 6,226,776 B1 | * | 5/2001 | Panchul et al. .................. | 716/3 |
| 6,226,777 B1 | * | 5/2001 | Zhang .................. | 716/5 |
| 6,292,765 B1 | * | 9/2001 | Ho et al. .................. | 703/14 |
| 6,298,472 B1 | * | 10/2001 | Phillips et al. .................. | 716/18 |
| 6,324,680 B1 | * | 11/2001 | Barnfield et al. .................. | 716/718 |
| 6,370,677 B1 | * | 4/2002 | Carruthers et al. .................. | 716/8 |
| 6,374,403 B1 | * | 4/2002 | Darte et al. .................. | 717/161 |
| 6,421,808 B1 | * | 7/2002 | McGeer et al. .................. | 716/1 |
| 6,421,815 B1 | * | 7/2002 | Seawright .................. | 716/7 |
| 6,484,304 B1 | * | 11/2002 | Ussery et al. .................. | 716/18 |
| 2001/0034876 A1 | * | 10/2001 | Panchul et al. .................. | 716/18 |
| 2002/0046391 A1 | * | 4/2002 | Ito et al. .................. | 716/18 |
| 2002/0104073 A1 | * | 8/2002 | Weerawarana et al. .................. | 717/114 |
| 2002/0138244 A1 | * | 9/2002 | Meyer .................. | 703/14 |
| 2002/0166110 A1 | * | 11/2002 | Powell .................. | 717/106 |
| 2002/0169588 A1 | * | 11/2002 | Grupp et al. .................. | 703/14 |
| 2003/0014743 A1 | * | 1/2003 | Cooke et al. .................. | 717/161 |

FOREIGN PATENT DOCUMENTS

WO    WO-97/13209 A1  *  4/1997  .......... G06F/17/50

OTHER PUBLICATIONS

Maruyama et al., "A C to HDL compiler for pipeline processing on FPGAs", 2000 Symposium on Field–Programmable Custom Computing Machines, Apr. 17, 2000, pp. 101–110.*

Micheli et al., "Hardware/Software Co–Design", Proceedings of the IEEE, vol. 85, No. 3, Mar. 1997, pp. 349–365.*

Cashar et al., "TPS–X—an automated graphical approach to TPS design", IEEE Systems Readiness Technology Conference, Sep. 21, 1992, pp. 189–194.*

(List continued on next page.)

Primary Examiner—Matthew Smith
Assistant Examiner—Phallaka Kik

(57) ABSTRACT

This invention is about a method of digital circuit design using programming language. It can solve problems raised by describing hardware using programming language, e.g. difficulties in describing changes within the same time step, and limitations in designing by sequential process. Separate variables are used to indicate registers and input of the registers. After the process of module section, the secondary variables are assigned to primary variables in a non-blocking assignment section. Combination circuits, which are used by more than one modules in module section, are defined in a assignment section and before module execution. Several clocks and gated clocks are described in non-blocking assignment section and loop section.

6 Claims, 8 Drawing Sheets

OTHER PUBLICATIONS

Kenyon et al., "High–level microprogramming: an optimizing C compiler for a processing element of a CAD accelerator", Proceedings of the 23$^{rd}$ Annual Workshop and Symposium on Microprogramming and Microarchitecture, Nov. 27, 1990, pp. 97–106.*

Sarkany et al., "Innovative techniques for improved testability", Proceedings of International Test Conference, Sep. 10, 1990, pp. 103–108.*

Takezawa et al., "Interactive design environment of VLSI architecture for digital signal processing", International Conference on Acoustics, Speech, and Signal Processing, vol. 2, Apr. 3, 1990, pp. 1085–1088.*

De Man, "Generalized combinations in functional languages and their applications", CompEuro '88, 'Design: Concepts, Methods and Tools', Apr. 11, 1988, pp. 9–14.*

Watanabe et al., "The ELIS interpreter–oriented Lisp–based workstation", Proceedings of the 2$^{nd}$ IEEE Conference on Computer Workstations, Mar. 7, 1988, pp. 70–79.*

NB9006283, "Global Computer Design", IBM Technical Disclosure Bulletin, Jun. 1990, vol. 33, No. 1B, pp. 283–285 (6 pages).*

* cited by examiner

```
1   #include      <stdio.h>
2   #include      <string.h>
3   typedef       unsigned char    BIT;        // 1 bit logic
4   typedef       unsigned char    BIT3;       // 3 bit logic
5   typedef       unsigned long    DWORD;
6   typedef       long             LONG27;     // 27 bit signed
7   typedef       long             LONG30;     // 30 bit signed
8   FILE          *fip;                        // pointer to input file
9   FILE          *fop;                        // pointer to output file
10  char     namei[256];                       // name of input file
11  char     nameo[256];                       // name of output file
12  DWORD    clk_cnt;                          // counter for simulation
13  int      data_in;                          // buffer of input data
14  short    data1;                            // input data
15  short    data2;                            // output data
16  BIT      rst_n;                            // reset signal (active low)
17  LONG27   mult;                             // output of multiplier
18  BIT3     state_cnt, state_cnt_i;           // state counter
19  short    s_reg[10], s_reg_i[10];           // shift register for data
20  LONG30   acc, acc_i;           // accumulator
21  /*================================================================*/
22  void  fir(){
23    int  i;
24    if (!rst_n)  {
25       state_cnt = 0;
26       acc = 0;
27       for (i=0; i<10; i++)    s_reg[i] = 0;
28    }
29    switch (state_cnt)  {
30        case 1:    mult =   20 * (s_reg[0] + s_reg[9]);   break;
31        case 2:    mult =  -42 * (s_reg[1] + s_reg[8]);   break;
32        case 3:    mult =   60 * (s_reg[2] + s_reg[7]);   break;
33        case 4:    mult = -106 * (s_reg[3] + s_reg[6]);   break;
34        case 5:    mult =  321 * (s_reg[4] + s_reg[5]);   break;
35        case 6:    mult =  506 *  s_reg[5];               break;
36        default:   mult =    0;
37    }
38    if ((state_cnt==1)||(state_cnt==6))   acc_i = mult + 256;
39    else                                  acc_i = acc + mult;
40    data2 = acc >> 9;
41    if (state_cnt==5)  {
42        s_reg_i[0] = data1;
43        for (i=1; i<10; i++)    s_reg_i[i] = s_reg[i-1];
44    }
45    if (state_cnt == 6)    state_cnt_i = 1;
46    else                   state_cnt_i = state_cnt + 1;
47  }
```

FIG.1A

```
48  /*================================================================*/
49  void  non_blocking_assignment()  {
50    int  i;
51    if (rst_n)  {
52      state_cnt = state_cnt_i;
53      acc = acc_i;
54      for (i=0; i<10; i++)    s_reg[i] = s_reg_i[i];
55    }
56  }
57  /*================================================================*/
58  void  main()    {
59    printf("Input  File Name : "); gets(namei); // get input file name
60    printf("Output File Name : "); gets(nameo); // get output file name
61    if ((fip = fopen(namei,"rt"))==NULL)   // file open(Read text file)
62        { printf("Input file error!!\n"); return; }
63    if ((fop = fopen(nameo,"wt"))==NULL)   // file open(Write text file)
64        { printf("output file error!!\n"); fclose(fip); return; }
65    clk_cnt = 0;     // use only for simulation
66    while (1)  {
67      if (state_cnt==5)  {
68          if (fscanf(fip, "%d", &data_in)==EOF)  break;   // input data
69          data1 = (short)data_in;
70      }
71      if (clk_cnt==0)  rst_n = 0;
72      else             rst_n = 1;
73      fir();
74      if ((state_cnt==6)||(state_cnt==1))  {
75          fprintf(fop, "%d\n", (int)data2);    // output data
76      }
77      non_blocking_assignment();
78      clk_cnt++;
79    }
80    fclose(fip);    // input file close
81    fclose(fop);    // output file close
82  }
```

FIG.1B

```
1  module  fir( clk, rst_n, data1, data2, state_cnt );
2  input            clk;
3  input            rst_n;              // reset signal (active low)
4  input  [15:0]    data1;              // input data
5  output [15:0]    data2;              // output data
6  output [2:0]     state_cnt;          // state counter
7
8  reg    [26:0]    mult;               // output of multiplier
9
10 reg    [2:0]     state_cnt;          // state counter
11 reg    [15:0]    s_reg[0:9];         // shift register for data
12 reg    [29:0]    acc;                // accumulator
13
14 integer          i;                  // variable for loop count
15
16 /*==================================================================*/
17 always@(state_cnt or s_reg)
18   case (state_cnt)
19     3'd0:     mult =   20 * (s_reg[0] + s_reg[9]);
20     3'd2:     mult =  -42 * (s_reg[1] + s_reg[8]);
21     3'd3:     mult =   60 * (s_reg[2] + s_reg[7]);
22     3'd4:     mult = -106 * (s_reg[3] + s_reg[6]);
23     3'd5:     mult =  321 * (s_reg[4] + s_reg[5]);
24     3'd6:     mult =  506 *  s_reg[5];
25     default:  mult =    0;
26   endcase
27
28 always@(posedge clk or negedge rst_n)
29   if (!rst_n)
30     acc <= 30'd0;
31   else if ((state_cnt==3'd1)||(state_cnt==3'd6))
32     acc <= mult + 256;
33   else
34     acc <= acc + mult;
35
36 assign  data2 = acc >> 9;
37
38 always@(posedge clk or negedge rst_n)
39   if (!rst_n)
40     for (i=0; i<10; i=i+1)    s_reg[i] <= 16'd0;
41   else if (state_cnt==3'd5)  begin
42     s_reg[0] <= data1;
43     for (i=1; i<10; i=i+1)    s_reg[i] <= s_reg[i-1];
44   end
45
46 always@(posedge clk or negedge rst_n)
47   if (!rst_n)
48     state_cnt = 3'd0;
49   else if (state_cnt == 3'd6)
50     state_cnt <= 3'd1;
51   else
52     state_cnt <= state_cnt + 1;
53
54 endmodule
```

FIG.2

```
1   void timing() {
2     if (!rst_n) {
3       clk_cnt = 0;
4     }
5     if (clk_cnt == 2)   clk_cnt_i = 0;
6     else                clk_cnt_i = clk_cnt + 1;
7   }
8
9   void non_blocking_assignment() {
10    int  i;
11    if (rst_n) {
12      clk_cnt = clk_cnt_i;
13      reg_a = reg_a_i;
14      if (clk_cnt == 0) {
15        reg_b = reg_b_i;
16      }
17      if (clk_halt == 0)
18        reg_c = reg_c_i;
19      }
20    }
21  }
22
23  void loop() {
24    while(1) {
25      timing();
26      xxx();
27      non_blocking_assignment();
28    }
29  }
```

FIG.4

```
1   void timing()  {
2     if (!rst_n)  {
3       clk_cnt = 0;
4     }
5     if (clk_cnt == 2)   clk_cnt_i = 0;
6     else                clk_cnt_i = clk_cnt + 1;
7   }
8
9   void non_blocking_assignment()  {
10    int  i;
11    if (rst_n)  {
12      clk_cnt = clk_cnt_i;
13      reg_a = reg_a_i;
14      reg_b = reg_b_i;
15      reg_c = reg_c_i;
16    }
17  }
18
19  void loop()  {
20    while(1)  {
21      timing();
22      xxx1();
23      if (clk_cnt == 0)    xxx2();
24      if (clk_halt == 0)   xxx3();
25      non_blocking_assignment();
26    }
27  }
```

FIG.5

DIGITAL CIRCUIT DESIGN METHOD USING PROGRAMMING LANGUAGE

BACKGROUND OF THE INVENTION

1. Field of the Invention

With LSI mini-scale technology development, a huge number of digital gates can be put into one LSI. Traditional circuit diagram design is regarded as time consuming especially for design and simulation. Therefore, it is desirable to have highly abstracted high level description languages. This invention is related to a digital circuit design method with which, after using program language to describe digital circuit, the source lists can be converted into hardware language, net lists or circuit diagram. This invention also introduces a compiler which can realize the above conversion; that is after the source lists being executed by computer, the simulator shows the results.

2. Description of the Prior Art

In traditional digital circuit design the hardware languages, such as the verilog-HDL or VHDL, are used. Since the circuit scale is becoming large, it is difficult to handle the whole system design and to use top-down design (i.e. specification) method to synthesize circuit by using hardware description languages. And also its simulation speed is slow.

Recently, programming languages such as C or C++ are adopted to design hardware, and for example C++ library called SystemC is introduced. Through C++ simulator it can solve the slow simulation problem caused by using hardware description language. However, this method has many limitations and the way of description is the same as the hardware description language. It is also hard to use top-down specification method to design digital circuit.

Although there are some other methods allowing the programming languages such as C or C++ to design hardware, their designs have limitations as well. Because In hardware description language, registers can change states within the same time step, but in procedural programming languages that use sequential process, it is difficult to describe changes occurring at the same time step.

In conclusion traditional compilers that transform programming language to hardware description language have the above-mentioned design limitations, and the simulator can only simulate those source lists created by restricted process.

SUMMARY OF THE INVENTION

The problem we want to solve is that, by using programming language such as C or C++, it is very difficult to describe register changes that occur at the same time. And because it requires sequential process, design is limited.

The key point for this design invention is that, when using programming language to describe register, it describes primary variables and secondary variables that express input of the register separately; after module process, assigns secondary variables to primary variables. To reduce the limitations caused by sequential process required by programming language, a assignment section which defines combination circuits for module section is executed before the module section. Several clocks, gated clocks and asynchronous resets/sets are described in a non-blocking assignment section.

This invention leads to a simple design by solving problems caused by programming language such as C or C++ when describing the hardware, and it also provides correlated compiler and simulator.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which:

FIG. 1A and FIG. 1B is an example (example1) of C program list that is described and designed by this digital circuit design invention.

FIG. 2 is an example of verilog-HDL codes, which are converted from the C program (example1).

FIG. 4 is an example of a part of C program (example3) for this digital circuit design invention.

FIG. 5 is an example of a part of C program (example4) for this digital circuit design invention.

DESCRIPTION OF THE PREFERRED EMBODIMENTS

Figure 3:
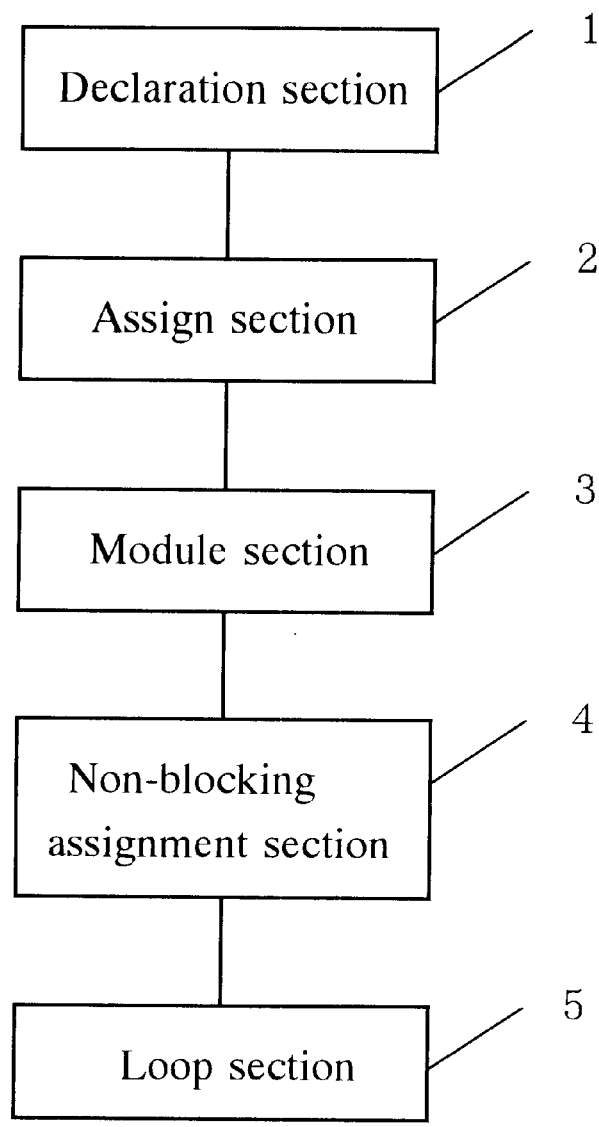
FIG. 3 is an example of a block diagram (example2) for this digital circuit design invention.

FIG. 1A and FIG. 1B is an example (example1) of program list in C program language, that mentioned by the present invention. It describes and designs twice oversampling FIR filter hardware. In the left-hand column the line numbers are indicated, and comments are indicated by sign "//". Others are C programming language written in the ANSI standard format. From line 1 to 20 is declaration section, line 22 to 47 is module section, line 49 till 56 is non-blocking assignment section, and line 66 till line 79 is loop section.

Line 1 in FIG. 1A includes library of the standard input/output. Line 2 includes library of commands for using character strings. Line 3 to line 7 define casts; among them Line 3 defines unsigned char as BIT and line 4 defines unsigned char as BIT3. This is because when we convert C program into hardware descriptive language, we allocate them to 1 bit or 3 bits terminal or register. In C programming language, since we cannot define 1 bit or 3 bits variables, we just assign it to a 8 bits unsigned char. The relationship between line 6 and line 7 is same as above.

Line 8 and 9 are file structure pointer declaration statements that are defined in line 1 [stdio.h]. They define pointers to input file and output file respectively. Line 10 and line 11 are character string variable declarations to denote the names of input file and output file. Line 12 is clock counter declaration statement for counting the simulation clock. Line 13 is variable declaration statement that set the buffer of input data. Line 14 and 15 declare variables for input and output data. Line 16 is about L reset signal input declaration statement. Line 17 is declaration statement about a multiplier output used as connection terminal. Line 18 through 20 declare register variables. Register is defined as "<name of variable>" and "<name of variable>_i", and the first variable indicates the output of register and the second variable indicates the D input of register. Declaring two variables by pair can clearly express register.

Line 22 through 47 are codes for a FIR filter function fir( ). Line 49 through 56 of FIG. 1B describe a non_ blocking_assignment( ) function with the same effect as the hardware language function does, i.e. making register changes synchronously when clock changes. Line 58 through 82 of FIG. 1B is the main function that simulate the FIR filter.

When execution, the program starts from main( ) function. At line 59 it asks name of input file and at line 60 it asks name of output file. At line 61 it tries to open input file and if the file cannot be opened, line 64 will show an error message. At line 63 it tries to open output file and if not opened, line 64 will show an error message. Line 65 reset clock counter clk_cnt to 0, followed by a loop section from line 66 through 79. Line 67 indicates that when state_cnt is 5 it will start to read data from input file. At line 68 it reads data and if it reaches the end of the file then it will end the loop that starts from line 66. Since the function described in line 68 needs to input data into int variables, in line 69 it casts the int data into 16 bits short variables. Line 71 indicates that when clk_cnt is 0 (loop starting point) assign 0 to rst_n and sends reset signal to each register; when clk_cnt is not 0 then in line 72 set rst_n to 1 and discharge reset signal from each register. Line 73 calls the FIR filter function body fir( ). In line 74 it indicates when the FIR filtered result for the data from input file needs to be written to the output file, i.e. when state_cnt is 6 or 1 they are output. Since twice over-sampling is needed, it outputs twice. Line 75 indicates that data2 is cast into int variable during output. Line 77 declares a non_blocking_asignment( ) function. Line 78 indicates clock counter increment. Line 80 and 81 indicate the program ends by closing input file and output file when input file reaches the end.

This paragraph is introducing the FIR filter body fir( ) function. Line 23 is a local variable declaration. In line 24 when rst_n is 0 it will go to reset asynchronously the register, and from line 25 to 27 each register output is reset. In line 45 and 46 when discharge reset, state_cnt repeats numbers from 1 to 6. When state_cnt is 6, state_cnt_i is assigned by 1, otherwise increment state_cnt. Through line 41 to 44, if state_cnt in line 41 is 5 then do line 42 and 43. Line 42 assigns data1 from input file to the first shift register input s_reg_i[0]. Line 43 assigns each register input to the previous output to realize shift action. Line 29 switches the processes according to the state_cnt value. From line 30 to 34, according to the state_cnt value, each coefficient is multiplied by the value of each register. Here adding two values of registers can reduce the number of times of multiplication by using symmetric coefficient. In line 35 the output values from the twice over-sampling filter are multiplied by coefficients of less than 1 to avoid ripples caused by clip. Each coefficient is an integer and since it will be right shifted by 9 bits, we divide it by 512. Line 36 means to stop multiplier when there is no calculation. Line 38 indicates that at the FIR calculation starting point, the multiplier outputs are rounded off and right shifted by 9 bits, and are added by 256 before assigning them to accumulator input acc_i. Line 39 indicates the other situation in which the sum of accumulator acc and multiplier mult is assigned to accumulator input acc_i. At line 40 it cuts the last 9 bits of value of the accumulator and assigns the result to data2.

This paragraph will explain the non_blocking_assignment( ) function. Line 50 is a local variable declaration statement. At line 51 when rst_n is 1 it will discharge reset and assign each D input of register to register output, and line 52 to line 54 do the assignments simultaneously. When rst_n is not 1, it means in the process of reset and will not assign D input to the output of register. It realizes asynchronous reset by judgements (line 51 and line 24 in fir( )).

FIG. 2 is an example of verilog-HDL codes, which are converted from the C program (example1). This is the twice over-sampling FIR filter, transferred to one of a hardware description language verilog-HDL from the hardware described by C programming language. Only circuit function fir( ) is transferred and the values of left hand side indicate the line numbers.

The first line of FIG. 2 indicates the start of module fir( ), and the arguments among them are variables for input and output data. Line 2 is a input clock signal declaration statement. This signal does not appear in C program of FIG. 1A and FIG. 1B. Because in C program the loop execution for one time is regarded as 1 clock cycle, we thus declare a new clock signal here. Line 3 declares the input signal rst_n that is converted from line 16 of FIG. 1A. Line 4 declares data1 that is converted from line 14 of FIG. 1A. Line 5 declares output signal data2 that is converted from line 18 of FIG. 1A. Line 8 declares connection terminal mult that is converted from line 17 of FIG. 1A. "LONG27" indicates 27 bits length. To declare connection terminal as "reg" is required by the rules of verilog-HDL in "always@" from line 17 to line 26 where the signal is assigned. Line 10 declares register state_cnt, we know this from line 18 of FIG. 1A because of the existence of state_cnt and state_cnt_i. And by declaring "BIT3", we know it outputs 3 bits signal. Line 11 declares 10 registers s_reg which are from line 19 of FIG. 1A, where we know s_reg and s_reg_i representing registers and there are 10 of them. Line 12 declares register acc, which corresponds to register acc and acc_i in line 20 of FIG. 1A where "LONG30" indicates 30 bits. Line 14 declares integer variable i converted from line 23 of FIG. 1A. It is seen that the digital circuit written by C program can be easily converted to verilog-HDL through this invention.

Line 17 to line 26 are converted from line 29 to line 37 of FIG. 1A; line 28 to 34 from line 38 to 39; line 36 from line 40; line 38 to 44 from line 41 to 44; and line 46 to line 52 from line 45 to 46. Description of asynchronous reset for register rst_n is converted from line 24 to line 28 of FIG. 1A. Line 54 indicates the end of this module. The sign "<=" denotes non_blocking assignment according to verilog-HDL rule. The use of this sign indicates that synchronous changes caused by clock are not depending on sequence of description.

FIG. 3 is an example of a block diagram of example 2 that is implemented by this invention. Number 1 is for declaration section; 2 for assignment section; 3 for module section; 4 for non_blocking assignment section; and 5 for loop section. Except the declaration section, when calling each section within the loop the following order could be used: assignment section 2, module section 3, non_blocking assignment section 4, and the order of description is optional. Modules section 3 has more than one module.

There are more than one function in each module section, non_blocking_assignment section, loop section within assignment section and module section. In declaration section variables needed by each function are declared. Variables that are declared outside of a function are called global variables, and these variables can also be used inside in a function. Variables can be declared inside a function, and these variables are called local variable and only valid inside a function. In this example we use global variables because they make simulation more efficient: one does not need to make input/output list anymore when using them inside a module and that saves the description time. When converting to digital circuit, we use individual to represent connective terminal and use separate variables to represent register's D input and output.

Inside module section 3, the output of that combination circuits (logic circuit does not use registers) that for each module are defined in assignment section 2. It is necessary to define those outputs before module declaration because registers are assigned in non-blocking assignment section 4 and they are no longer restricted by programming order. However those outputs can only be used after they are defined inside the combination circuit. If they are defined inside modules, then they cannot be used when those modules are called before their definition. Therefore, it is necessary to define those output variables used by several modules before module declaration.

The detailed processes of digital circuit synthesis are described in module section 3. Assignment to the register is described as assignment to the D input of register. In non-blocking assignment section 4, all D input variables are assigned to register variables. Loop section 5 describes those actions invoked by synchronous clock.

FIG. 4 is an example (example3) that is designed by this invention. This is a part of C program that includes several clocks or gated clocks. The numbers in the left again indicate the line numbers.

In FIG. 4 line 1 through line 7 is a function of timing( ) that generates timing signal; clk_cnt is a register that counts clock cycles and clk_cnt_i is its D input. Through this function, clk_cnt is set to 0 when asynchronous reset is needed, i.e. when clk_cnt is 2 then set it to 0; otherwise set to +1, which generates the second clock that is different from one loop cycle clock. Line 9 to 21 is non_blocking_ assignment( ) function, in asynchronous reset it will skip non_blocking_assignment( ) by line 11. When discharge is reset, at each clock clk_cnt and reg_a are assigned by each loop execution. At line 14 only when clk_cnt is 0 then reg_b is assigned in order to describe the action that invoked by several clocks. At line 17 only when ckl_halt (values are assigned by other module) is 0 then reg_c is assigned, and when it is 1 then previous value is held. The registers of reg_a, reg_b, reg_c are needed by the preceding function xxx( ). From line 23 to 29 is the loop section function loop( ) which includs timing( ), module xxx( ) and non_blocking_assignment( ). The circuit action is described by function xxx( ) (see diagram).

FIG. 5 is an example (example4) that designed by this invention. This is a part of C program that includes several clocks or gated clocks. The numbers in the left-hand side indicates the line numbers.

In FIG. 5, line 1 through line 7 describe a function of timing( ) that generates timing signal; clk_cnt is a register that counts clock cycles and clk_cnt_i is the D input. With this function, clk_cnt is set to 0 when asynchronous reset is needed. When clk_cnt is 2 then set it to 0, otherwise set to +1 which generate the second clock that is different from one loop cycle clock. Line 9 to 7 is non_blocking_assignment( ) function. When asynchronous reset is needed the non_blocking_assignment will be skipped at line 11. When reset is discharged, clk_cnt, reg_a reg_b, reg_c will be assigned at each loop execution. Line 19 to 27 is loop section function loop( ) which includes timing( ), module function xxx1( ), xxx2( ), xxx3( ) and non_blocking_assignment( ). Function xxx1( ) is invoked by each clock; and xxx2( ) is invoked when clk_cnt is 0 (every three clocks); xxx3( ) is invoked when clk_halt is 1 (clock stopped, so called gated clock). reg_a is a variable used in xxx1( ), reg_b is a variable used in xxx2( ), reg_c is a variable used by xxx3( ).

Figure 6:
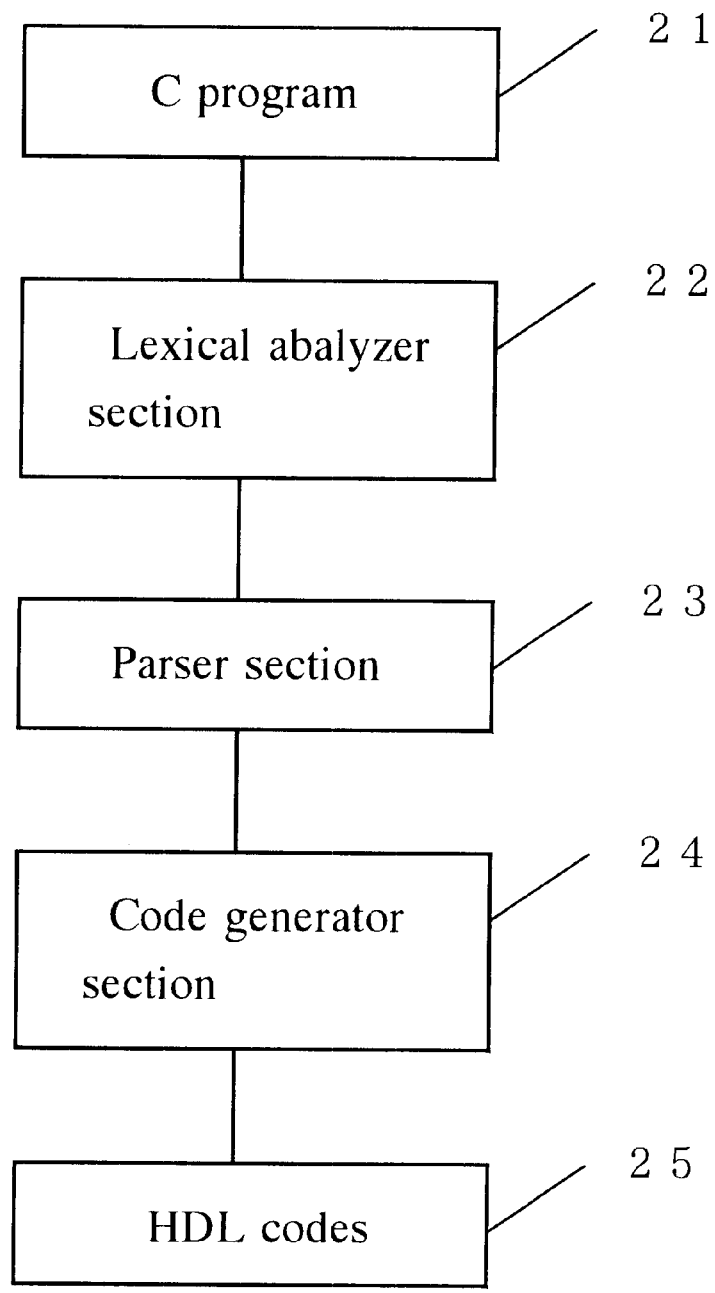
FIG. 6 is an example of a compiler (example5) for this digital circuit design invention.

FIG. 6 is an example of block diagram (example5) that represents a compiler. Section 21 is for a C program (like FIG. 1A and FIG. 1B); 22 for lexical analyzer section; 23 for parser section; 24 for code generator section (constituted by programs inside computer); and 25 for HDL codes (an example of verilog-HDL list as output file represented by FIG. 2).

In FIG. 6 the C program 21 that is read by computer is divided into variables or operator called tokens. In lexical analyzer section 23, the meaning of tokens is analyzed. In C program, if a variable is constituted by two variables such as xxx and xxx_i, then it should be a register, and if only constituted by one variable it should be a connection terminal. The result coming from lexical analyzer section 23 is sent to code generator section 24, where converting C program to verilog-HDL, and then output to HDL codes 25. Register variable is synthesized with latch (which changes value according to clock), while connection terminal variables are synthesized with combinational circuit. When in C program 21 several clocks or gated clocks are used (like FIG. 4), the name of "always@" in the verilog-HDL code is changed into regular clock and is synthesized. In this example, the resulted digital circuit could be in verilog-HDL, but can also be in net lists or circuit diagram of LSI cell.

Figure 7:
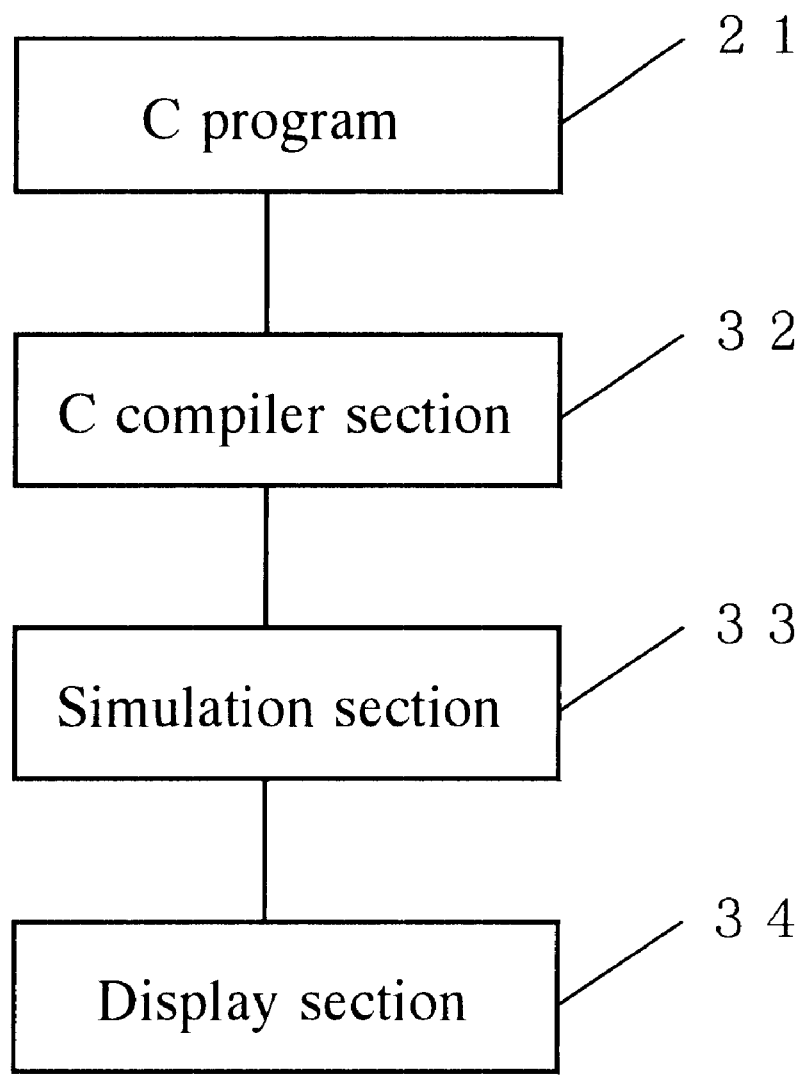
FIG. 7 is an example of a simulator (example6) for this digital circuit design invention.

FIG. 7 is an example of block diagram of a simulator (example 6) that designed by this invention. Section 21 is for C program (like FIG. 1A and FIG. 1B), 32 for C compiler section, 33 for simulation section, and 34 for simulation result display section (constituted by program inside computer).

In FIG. 7 the C program 21 that is read by computer is converted to a format that can be executed by compiler section 32. For example, the C program 21 in FIG. 1A and FIG. 1B is complied and converted to executable object codes on a computer, and then the data from designated input file are read, then they go through the FIR filter which is described by C program and then they are output to a certain file. In simulation section 33, the object codes are executed and each value of variables in the C program 21 are remembered. According to the command of operator, necessary data are transferred as simulation result to the display section 34. There are several debugging functions such as brake point setting, execute until pointer, and execute step in simulation section. Display section 34 can display data transferred from simulation section 33 in graphic or text style by command of operator.

In describing register the first variable and second variable (express input of the register) are represented separately. After module process, the second variable is assigned to the first variable by non-blocking assignment. After converted to HDL, it is easy to describe non-blocking assignment and similar process. To reduce the limitations caused by sequential process of programming language, the assignment section which defines combination circuit for module section is executed before the module section. It is easy to deal with several clocks and gated clocks, and asynchronous reset/set are described in the assignment section.

By using the compiler introduced by this invention, it is easy to convert C program to HDL circuit information, and by using the simulator it is also easy to simulate and debug C program that written based on the idea of this invention.

What is claimed is:

1. A digital circuit design method that uses programming language to describe digital circuit, comprising:

providing more than one primary variables which indicate registers;

providing more than one secondary variables which indicate inputs of the registers;

providing a loop section which repeats actions according to clock cycles;

providing a module section which indicates circuit action; and providing a non-blocking assignment section which assigns secondary variables to primary variables at a same time step, after executing the module section inside the loop section.

2. A digital circuit design method in claim 1, further including:

providing a assignment section which defines combinational circuits which are used by more than one modules, and executes before said module section execution.

3. A digital circuit design method in claim 1, wherein said non-blocking assignment section has conditional statement that decides whether or not to assign several clocks and gated clocks or asynchronous reset/set.

4. A digital circuit design method in claim 1, wherein said loop section has conditional statement that decides whether or not to execute a process that expresses several clocks and gated clocks.

5. A digital circuit design method in claim 1, further comprises providing a compiler that transforms programming language to hardware description language, said compiler comprising:

a lexical analyzer section which reads a program which includes more than one primary variables which indicate registers, more than one secondary variables which indicate the input of the registers, a loop section which repeats actions according to the clock cycles, module section which indicates the circuit action, and non-blocking assignment section which assigns secondary variables to primary variables at a same time step, after executing the module section inside the loop section;

a parser section which analyzes an output of said lexical analyzer section; and a code generator section which transfers source lists into one of hardware description language, net lists, circuit diagram and other circuit information.

6. A digital circuit design method in claim 1, further comprises providing a simulator that simulates program on a computer, said simulator comprising:

a compiler section that compiles program to executable object codes on a computer, wherein said object codes include more than one primary variables which indicate registers, more than one secondary variables which indicate the input of the registers, a loop section which repeats actions according to the clock cycles, module section which indicates the circuit action, and non-blocking assignment section which assigns secondary variables to primary variables at a same time step, after executing the module section inside the loop section;

a simulation section that simulates output from compiler on the computer; and a display section that displays result of simulation.

\* \* \* \* \*